United States Patent
Zhang et al.

(10) Patent No.: US 9,541,873 B2
(45) Date of Patent: Jan. 10, 2017

(54) CARBON NANOPARTICLE AND FLUORPOLYMER COMPOSITE FUSER COATING

(71) Applicant: XEROX CORPORATION, Norwalk, CT (US)

(72) Inventors: Qi Zhang, Milton (CA); Nan-Xing Hu, Oakville (CA); Suxia Yang, Mississauga (CA); Sandra J. Gardner, Oakville (CA); Edward G. Zwartz, Mississauga (CA); Yu Qi, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 302 days.

(21) Appl. No.: 14/260,802

(22) Filed: Apr. 24, 2014

(65) Prior Publication Data

US 2015/0309452 A1    Oct. 29, 2015

(51) Int. Cl.
*H01B 1/04* (2006.01)
*G03G 15/20* (2006.01)

(52) U.S. Cl.
CPC ............. *G03G 15/2057* (2013.01); *H01B 1/04* (2013.01)

(58) Field of Classification Search
CPC ........................................................ H01B 1/04
See application file for complete search history.

(56) References Cited

U.S. PATENT DOCUMENTS

| 4,373,239 A | 2/1983 | Henry et al. |
| 5,501,881 A | 3/1996 | Fuller et al. |
| 5,512,409 A | 4/1996 | Henry et al. |
| 5,729,813 A | 3/1998 | Eddy et al. |
| 8,557,345 B2 | 10/2013 | Qi et al. |
| 2010/0189943 A1* | 7/2010 | Qi ............... G03G 15/2057 428/36.4 |
| 2011/0103854 A1 | 5/2011 | Gervasi et al. |
| 2013/0017005 A1 | 1/2013 | Zhang et al. |

OTHER PUBLICATIONS

Yu Qi et al., "Graphene and Fluorpolymer Composite Fuser Coating", U.S. Appl. No. 14/044,352, filed Oct. 2, 2013, 33 pages.
Yang et al., "Dual Layer Composite Coating and Method for Making Same," U.S. Appl. No. 14/260,911, filed Apr. 24, 2014, 31 pages.

\* cited by examiner

*Primary Examiner* — William Young
(74) *Attorney, Agent, or Firm* — MH2 Technology Law Group LLP (57) ABSTRACT

A fuser comprises a substrate and a composite layer formed on the substrate. The composite layer comprises a fluoropolymer and at least one of (a) perfluorosulfonated polymer-treated, carbon nanotube-comprising particles, and (b) perfluorosulfonated polymer-treated, graphene-comprising particles. Methods of making a fuser and methods of fusing toner particles are also disclosed.

10 Claims, 11 Drawing Sheets

CARBON NANOPARTICLE AND FLUORPOLYMER COMPOSITE FUSER COATING

DETAILED DESCRIPTION

Field Of The Disclosure

The present disclosure is directed to a fuser top coat comprising a plurality of perfluorosulfonated polymer-treated, carbon nanotube-comprising particles and fluoropolymer, as well as a fuser top coat comprising a plurality of perfluorosulfonated polymer-treated carbon nanotube-comprising particles, perfluorosulfonated polymer-treated, graphene-comprising particles, and fluoropolymer.

BACKGROUND

It is desirable to increase thermal conductivity of fuser coating materials to enable higher fusing speed, wider fusing latitude, lower fusing temperature and/or lower minimum fixing temperature. Various thermally conductive fillers have been disclosed for this purpose. As an example, carbon nanotubes (CNT) have been employed in topcoat materials, such as fluoropolymers, to form nanocomposite topcoats. Such materials have demonstrated the capability for increased speed and improved fuser service life. However, it is challenging to develop CNT-in-fluoropolymer composite coatings due to poor compatibility and dispersibility of the CNTs.

Another potential filler material that has recently garnered significant attention is graphene. Graphene is often described as a two dimensional sheet of sp2 bonded carbon atoms arranged in a hexagonal lattice. Due to unique structural features, graphene possesses superior thermal and electrical conductivity, as well as high mechanical strength. Incorporation of graphene into fluoroplastics can improve thermal and/or electrical conductivity and mechanical robustness of the resulting composite material. Both individual graphene sheets and graphene platelets, which include a plurality of graphene layers, show enormous potential as fillers for composite applications. However, it is challenging to make uniform, well-dispersed graphene composite materials with fluoroplastics that are suitable for use in fuser applications. This is due, in part, to properties of graphene in nano-particle form and/or graphene's general incompatibility with fluoropolymers. Phase separations and graphene agglomerations are often associated with poorly dispersed composites, which hinder full utilization of the unique properties of graphene.

Conventional formulations with both graphene and carbon nanotubes include aqueous systems, or require complicated surface treatment processes to produce defect-free composite coatings.

Discovering a novel fluoropolymer composite fuser topcoat material and/or techniques for achieving well dispersed carbon nanotubes and/or graphene in fluoropolymer composities would be a desirable step forward in the art.

SUMMARY

An embodiment of the present disclosure is directed to a fuser. The fuser comprises a substrate; and a composite layer formed on the substrate. The composite layer comprises a plurality of perfluorosulfonated polymer-treated, carbon nanotube-comprising particles and fluoropolymer.

Another embodiment of the present application is directed to a method for making a fuser. The method comprises providing a substrate. A coating composition is flowcoated onto the substrate. The coating composition comprises a liquid continuous phase; and a plurality of composite particles dispersed in the liquid continuous phase. The composite particles can each comprise a perfluorosulfonated polymer-treated, carbon nanotube-comprising particle and a fluoropolymer particle. The coating composition on the substrate is heated at a baking temperature to form a fuser outer layer.

Yet another embodiment of the present application is directed to a method of fusing toner particles to a substrate. The method comprises providing a print substrate. An image of toner particles is formed on the print substrate. The toner particles on the print substrate are contacted with a fuser roll heated to a fusing temperature to permanently affix the image to the substrate. The fuser roll comprises a fuser substrate and a composite layer formed on the fuser substrate. The composite layer comprises a plurality of perfluorosulfonated polymer-treated, carbon nanotube-comprising particles and a fluoropolymer.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

Process for Making a Perfluorosulfonated Polymer-Treated, Carbon Nanoparticle-Comprising Particle/Fluorocarbon Polymer Composite An embodiment of the present disclosure is directed to a process for making a composite. The composite includes: perfluorosulfonated polymer-treated, carbon nanoparticle-comprising particles and a fluorocarbon. Carbon nanoparticles-comprising particles can include at least one selected from the group consisting of carbon nanotube-comprising particles and graphene-comprising particles. Thus, the composite can include (i) perfluorosulfonated polymer-treated, carbon nanotube-comprising particles and a fluorocarbon polymer, or (ii) (a) perfluorosulfonated polymer-treated, carbon nanotube-comprising particles, (b) perfluorosulfonated polymer-treated, graphene-comprising particles and (c) a fluorocarbon polymer. The process can include mixing carbon nanotube-comprising particles, a perfluorosulfonated polymer compound and a first liquid continuous phase to form a perfluorosulfonated polymer-treated carbon nanotube-comprising particle dispersion. The process can also include mixing graphene-comprising particles, a perfluorosulfonated polymer compound and a second liquid continuous phase to form a perfluorosulfonated polymer-treated, graphene-comprising particle dispersion. The perfluorosulfonated polymer-treated, carbon nanotube-comprising particle dispersion and the perfluorosulfonated polymer-treated, graphene-comprising particle dispersion can then be mixed with a fluorocarbon polymer particle dispersion comprising a third liquid continuous phase. While not limited to any particular theory, it is believed that the perfluorosulfonated polymer-treated, carbon nanotube-comprising particles and the perfluorosulfonated polymer-treated, graphene-comprising particles adhere to the fluorocarbon polymer particles to form composite particles such as those shown in FIGS. 4A-5B which are described below. The composite particles comprising the fluorocarbon polymer and the perfluorosulfonated polymer-treated, carbon nanotubes-comprising particles and/or the perfluorosulfonated polymer-treated, graphene-comprising particles can be further treated with a leveling agent/coalescent to form a homogenous coating dispersion. The coating dispersion can then be deposited, for example, via flow coating, onto a substrate then baked and dried to form a coating as described further below.

Carbon Nanotube-Comprising Particles

Any suitable carbon nanotube-comprising particles can be employed in the composites of the present disclosure. In an embodiment, the carbon nanotube-comprising particles can include carbon nanotubes such as single wall nanotubes such as single wall carbon nanotubes (SWCNTs), multi-wall nanotubes such as multi-wall carbon nanotubes (MWCNTs), and their various functionalized and derivatized fibril forms such as nanofibers. Accordingly, the term "carbon nanotube-comprising particles" can include carbon nanotubes including SWCNTs and/or MWCNTs. Furthermore, the term "carbon nanotube-comprising particles" can include modified carbon nanotubes from all possible carbon nanotubes described above and their combinations. The modification of the carbon nanotubes can include a physical and/or a chemical modification. The carbon nanotubes can have an inside diameter and an outside diameter. For example, the inside diameter can range from about 0.5 to about 20 nanometers, while the outside diameter can range from about 1 to about 80 nanometers. The nanotubes can have an aspect ratio, e.g., ranging from about 1 to about 10000.

Carbon nanotube-comprising particles can be present in the composite in any desired amount. Examples include amounts less than about 90 weight %, based on the total weight of the composition, such as about 1 weight % to about 50 weight %, about 1 weight % to about 20 weight %, about 1 weight % to about 4 weight %, about 1 weight % to about 2 weight % or about 2 weight % to about 4 weight %.

Graphene-Comprising Particles

Any suitable graphene-comprising particles can be employed in the composites of the present disclosure. In an embodiment, the graphene-comprising particles can include graphene, graphene platelets and mixtures thereof. Graphene platelets are unique nanoparticles comprising short stacks of graphene sheets. They can have an average thickness of, for example, approximately 6 nm to approximately 8 nm. In an embodiment, they can have a relatively large per unit surface area, such as, for example, about 120 to 150 $m^2/g$. Such graphene-comprising particles are well known in the art.

Graphene-comprising particles can be present in the composite in any desired amount. Examples include amounts less than about 90 weight %, based on the total weight of the composition, such as about 1 weight % to about 50 weight %, about 1 weight % to about 20 weight %, about 1 weight % to about 4 weight %, about 1 weight % to about 2 weight % or about 2 weight % to about 4 weight %.

Perfluorosulfonated Polymer Compounds

Figure 1A:
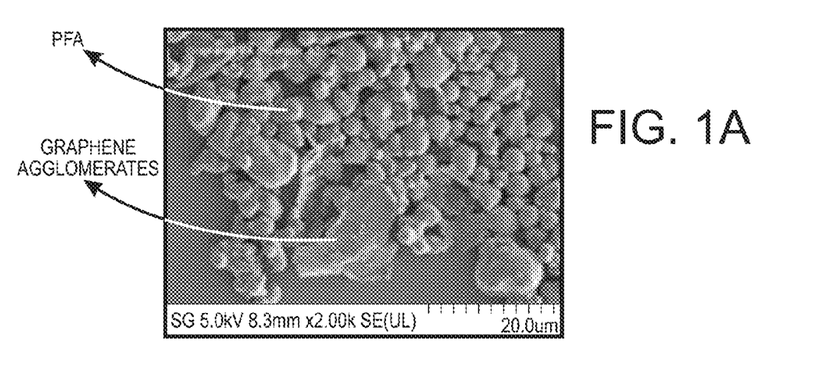
FIGS. 1A to 1C show SEM images of graphene/perfluoroalkoxy polymer resin (PFA) dispersion and coatings in which the graphene is not treated with perfluorosulfonated polymer.
Figure 1B:
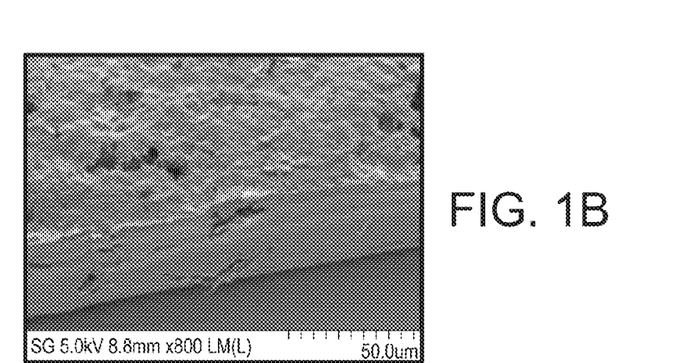
Figure 1C:
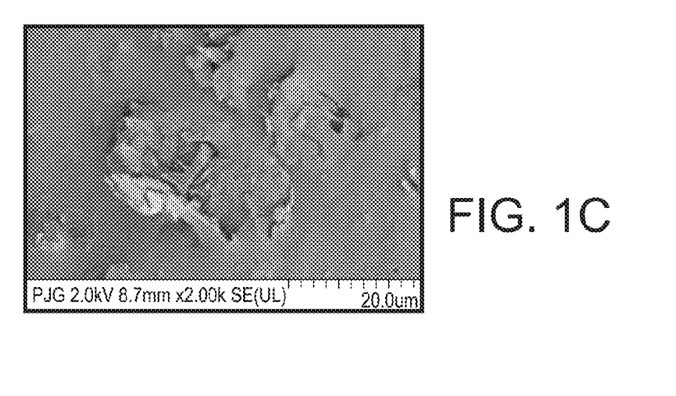
Figure 2A:
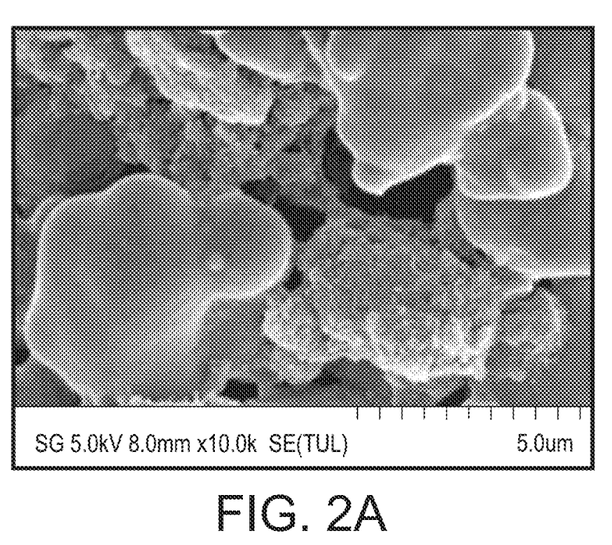
FIG. 2A shows an SEM image of a CNT/PFA/cyclohexanone (CHN) dispersion in which the CNTs are not treated with perfluorosulfonated polymer.
Figure 2B:
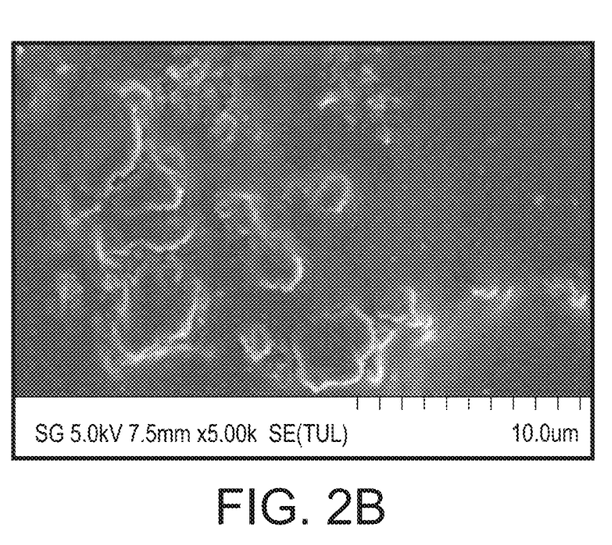
FIG. 2B is an SEM image of a CNT/PFA coating made from the dispersion of FIG. 2A.
Figure 3A:
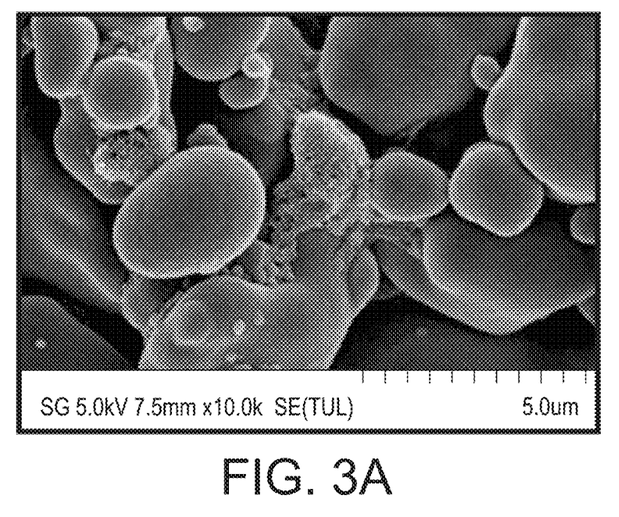
FIG. 3A is an SEM image of a CNT/PFA/IPA dispersion in which the CNTs are not treated with perfluorosulfonated polymer.
Figure 3B:
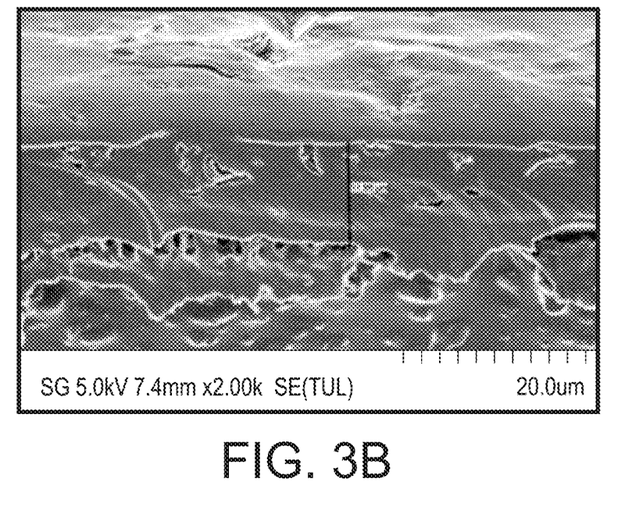
FIG. 3B is an SEM image of a CNT/PFA coating made from the dispersion of FIG. 3A.

As described above, it is challenging to make uniform composite materials having well-dispersed graphene in fluoropolymers, such as fluoroplastics, due to carbon nanoparticles' nano-size material nature and general incompatibility with fluoropolymers. By sonication, carbon nanoparticles can be dispersed to a certain extent into a liquid continuous phase that is used for a flow-coatable fluoropolymer formulation. However, phase separation can be a problem when mixing the carbon nanotubes dispersion and/or the graphene dispersion with the flow-coatable fluoropolymer formulation. For example, graphene platelets tend to agglomerate together (irregular chunky plates) and separate out from PFA particles (round and smooth particles), as can be seen in FIG. 1A. The composite coatings made from one such graphene dispersion showed undesirable large voids with agglomerates of graphene platelets, as shown in FIGS. 1B and 1C. Additionally, CNTs tend to agglomerate together even when dispersions include materials such as poly(alkyl carbonate) (PAC) as a transient binder in a ketone solvent system, as shown in FIG. 2A, or in isopropanol solvent systems with poly(acrylic acid) used as a dispersant, as shown in FIG. 3A. The composite coatings made from such conventional CNT dispersions showed undesirable large voids with agglomerates of CNTs, as shown in FIGS. 2B and 3B.

To address the problems of combining carbon nanotubes and fluoropolymers and the problems of combining graphene and fluoropolymers, carbon nanotube-comprising particles and graphene-comprising particles of the present disclosure are treated with a perfluorosulfonated polymer to increase affinity with fluoropolymer particles. The treatment can be carried out in any desired manner.

In an embodiment, the carbon nanotube-comprising particles and the graphene-comprising particles are exfoliated. In an embodiment, the carbon nanotube-comprising particles and the graphene-comprising particles are separately exfoliated. In other words, exfoliation of the carbon nanotube-comprising particles may be conducted separately from the exfoliation of the graphene-comprising particles. In an embodiment, the carbon nanotube-comprising particles are exfoliated by, for example, sonication of carbon nanotubes in a first liquid continuous phase comprising one or more perfluorosulfonated polymer compounds to provide a generally uniform carbon nanotube dispersion containing the perfluorosulfonated polymer. Similarly, the graphene-comprising particles are exfoliated by, for example, sonication of graphene in a second liquid continuous phase comprising one or more perfluorosulfonated polymer compounds to provide a generally uniform graphene dispersion containing the perfluorosulfonated polymer. Any other suitable method for exfoliating the carbon nanotubes-comprising particles and the graphene-comprising particles can be used in place of, or in addition to, sonication.

Any perfluorosulfonated polymer that can provide an improvement in the carbon nanotubes dispersion compared to untreated carbon nanotubes, and can provide an improvement in the graphene dispersion compared to untreated graphene, and which will not have a serious negative impact on subsequent processing steps, can potentially be used. In an embodiment, the same perfluorosulfonated polymer is used for treating the carbon nanotube-comprising particles and the graphene-comprising particles. In an embodiment, a first perfluorosulfonated polymer is used for treating the carbon nanotube-comprising particles and a second perfluorosulfonated polymer is used for treating the graphene-comprising particles, wherein the first and the second perfluorosulfonated polymers are different from one another.

In an example, the perfluorosulfonated polymer can be represented by formulae (I):

where m is an integer greater than or equal to 1, n is an integer greater than or equal to 1, p is an integer greater than or equal to 1, X is a sulfonic functional group, and M is a metal cation in the neutralized form, an H+ in the acid form, or a functional such as a functional group selected from —OH, —OSi(CH3)$_3$.

In an example, the perfluorosulfonated polymer can be represented by formulae (II)

where m is an integer greater than or equal to 1 and n is an integer greater than or equal to 1.

In an example, the perfluorosulfonated polymer can be represented by formulae (III):

where m is an integer greater than or equal to 1, n is an integer greater than or equal to 1, and p is an integer greater than or equal to 1.

In an embodiment, the perfluorosulfonated polymer include commercially available tetrafluoroethylene based fluoropolymer-copolymer NAFION® 117 solution (available from Sigma-Aldirch, CAS 31175-20-9). In an embodiment, the perfluorosulfonated polymer include commercially available tetrafluoroethylene based fluoropolymer-copolymer NAFION®, trimethylsilylated (available from Sigma-Aldrich, Product No. 382928).

Any other perfluorosulfonated polymer, or combination of perfluorosulfonated polymers, that can provide a stable CNT-fluoropolymer dispersion and a stable graphene-fluoropolymer dispersion can also be used.

Liquid Continuous Phase

The carbon nanotubes-comprising particles and perfluorosulfonated polymer compounds are mixed in a second liquid continuous phase. Any suitable liquid continuous phase suitable for dispersing carbon nanotubes can be employed. Similarly, the graphene-comprising particles and perfluorosulfonated polymer compounds are mixed in a second liquid continuous phase. Any suitable liquid continuous phase suitable for dispersing graphene can be employed. Examples of suitable organic liquid continuous phases for the first and second liquid continuous phases include alcohols, such as isopropanol (IPA), N-methyl-2-pyrrolidone, methlethylketone, cyclohexanone, an ester alcohol, or a combination thereof. In an embodiment the same organic liquid continuous phase can be selected for the first and second liquid continuous phases. One of ordinary skill in the art would be able to determine liquid continuous phase compounds suitable for dispersing carbon nanotubes and graphene from any of the sub-genuses listed above.

It may be that the first and/or second liquid continuous phases are not compatible with subsequent processing steps, such as the use of a polymer binder and/or fluoropolymer particles subsequently mixed with the graphene, as discussed in more detail below. If so, the first liquid continuous phase can be separated from carbon nanotubes after exfoliation and/or treatment with the perfluorosulfonated polymer and/or the second liquid continuous phase can be separated from the graphene after exfoliation and/or treatment with the perfluorosulfonated polymer, but prior to mixing with the incompatible compounds. Alternatively, if the first and/or second liquid continuous phase is compatible it can remain as part of the final composition.

By mixing the carbon nanotube-comprising particles and perfluorosulfonated polymer compounds in a liquid continuous phase, such as the first liquid continuous phase, a dispersion of perfluorosulfonated polymer-treated, carbon nanotubes-comprising particles can be formed. Similarly, by mixing the graphene-comprising particles and perfluorosulfonated polymer compounds in a liquid continuous phase, such as the second liquid continuous phase, a dispersion of perfluorosulfonated polymer-treated, graphene-comprising particles can be formed. Any other desired ingredients can be included in each dispersion, such as solvents or dispersants.

Fluoropolymer Particles

The perfluorosulfonated polymer-treated, carbon nanotubes-comprising particle dispersion and/or the perfluorosulfonated polymer-treated, graphene-comprising particle dispersion can be mixed with a third dispersion comprising fluorocarbon polymers. The third dispersion can be formed by any suitable method. In an embodiment, the third dispersion is formed by combining a fluorocarbon polymer and a third continuous liquid phase. The third continuous liquid phase can comprise any suitable liquid for forming a dispersion of the fluorocarbon polymers, such as any of the organic liquid continuous phase compounds taught herein; and can be the same as or different from the continuous liquid phase used in the carbon nanotube-comprising particle dispersion and/or the continuous liquid phase used in the graphene-comprising particle dispersion.

The fluorocarbon polymer can be in the form of solid particles that are dispersed in the third continuous liquid phase. Any suitable fluoropolymer particles can potentially be employed, depending on the desired characteristics of the composite composition. Examples of suitable fluoropolymers include fluoroplastic resins, such as polytetrafluoroethylene (PTFE) particles; perfluoroalkoxy polymer resin (PFA) particles; poly(tetrafluoroethylene-co-perfluoropropyl vinyl ether) particles, and fluorinated ethylenepropylene copolymers (FEP) particles.

While mixing, the treated carbon nanotubes-comprising particles and/or the treated graphene-comprising particles can associate with the fluoropolymer particles. For example, the treated carbon nanotubes-comprising particles and/or the treated graphene-comprising particles can chemically bond or otherwise adhere to the fluoropolymer particle surface. In an embodiment, the fluoropolymer comprises PFA particles, for example PFA320 (available from DuPont), to which the perfluorosulfonated polymer-treated, carbon nanotubes-comprising particles and/or the perfluorosulfonated polymer-treated, graphene-comprising particles adhere to form composite particles. In other words, composite particles can comprise the treated carbon nanotubes-comprising particles and/or the treated graphene-comprising particles adhered to the fluoropolymer particle surface.

Coating Dispersions

An embodiment of the present disclosure is directed to a coating dispersion and process of making the dispersion. The process can include forming a coating dispersion comprising the fluorocarbon polymer and perfluorosulfonated polymer-treated, carbon nanoparticle-comprising particles. For example, the process can include forming a coating dispersion comprising the fluorocarbon polymer and at least one of (a) the perfluorosulfonated polymer-treated, CNT-comprising particles, and (b) the perfluorosulfonated polymer-treated, graphene-comprising particles.

The coating dispersion may also comprise a coalescent. The coalescent may act as a leveling agent to provide improved flow coating rheology and final coating uniformity of the coating dispersion. Any suitable leveling agent and coalescent that does not negatively affect the coating properties can be employed. Examples of suitable leveling agent and coalescent include ester alcohols, such as 2,2,4-Trimethyl-1,3-pentanediol monoisobutyrate, for example, ester alcohol available under the tradename, TEXANOL™ (available from Eastman Chemical Company under CAS No. 25265-77-4 or product no. 538221 from Sigma-Aldrich, Co.), a polyvinyl butyral, poly(alkylene carbonates) and the like, or a combination thereof. The coalescent may be present in any suitable amount, such as, for example, about 0.1% to about 20% by weight, or about 1% to about 15%, or about 2% to about 5% by weight, based on the total weight of solids in the coating dispersion.

A plurality of the above described composite particles of the present disclosure can be dispersed in the coalescent. The composite particles can comprise a fluoropolymer particle and at least one of (a) the treated carbon nanotubes-comprising particles, and (b) the treated graphene-comprising particles. The composite particle dispersions are sufficiently stable to enable uniform deposition of carbon nanotubes/fluoropolymer composite, graphene/fluoropolymer composite or carbon nanotube/graphene/fluoropolymer composite on substrates without significant phase separation during the coating process.

The composite particles can be present in the coating dispersion formulation in any suitable amount. In an embodiment, the particles are present in an amount of 30 weight % or more, such as about 70 weight % to about 99 weight %, based on the total weight of the solid in the coating dispersion composition. The amount of total solid in the coating composition ranges from about 10 weight % to about 80 weight %, such as 20 weight % to 70 weight % or 30 weight % to 50 weight % of the total weight of the coating composition.

In an embodiment, the coating compositions of the present disclosure can include one or more additional conductive or non-conductive fillers. Examples of suitable fillers include metal particles and metal oxide particles. The amount of filler employed may depend on the desired properties of the product being manufactured. Any other desired ingredients can optionally be employed in the coating compositions of the present disclosure, including dispersing agents or solvents.

At least one of the coating dispersions can be deposited on a substrate by any suitable liquid coating method, such as flow-coating, dip-coating, spin-on coating and spray coating. The coatings can be heated to dry and/or cure the coating materials. In an example, composite coatings have been conveniently made by flow coating, followed by baking at temperatures above the fluoropolymer melting temperature. The resulting uniform carbon nanotube/fluoropolymer composite coating, graphene/fluoropolymer composite coating, and carbon nanotube/graphene/fluoropolymer composite coating can be electrically conductive, thermally conductive and/or mechanically robust. Further, the low surface energy property derived from PFA is not substantially negatively affected.

In an embodiment, some or all of the liquid continuous phase and some or all of the coalescent are removed during subsequent processing. For example, the liquid continuous phase and/or coalescent can be removed by heating to temperatures that are high enough to evaporate the liquid continuous phase and/or coalescent. The evaporation temperatures chosen can depend on the particular liquid continuous phase used, the particular coalescent used as well as the melting temperatures of the materials employed for the composite particles, among other things. For example, the PFA in CNT/PFA, graphene/PFA, or CNT/graphene/PFA composite particles may melt at temperatures of about 260° C. or higher. Therefore, temperatures high enough to melt and flow the PFA particles while at the same time removing the liquid continuous phase and/or coalescent can be used, while temperatures that are so high as to significantly decompose the PFA material or damage the substrate can be avoided. Examples of suitable temperatures for IPA liquid continuous phase and Texanol coalescent employed with CNT/PFA, graphene/PFA, or CNT/graphene/PFA composite particles can range from about 100° C. or more, such as about 300° C. to about 360° C., or about 330° C. to about 350° C. In an example, a baking process comprises a two-step process. In a first step, the coating composition deposited on a substrate is baked for a first amount of time, such as about 60 minutes, at a first temperature, such as about 100° C., to remove solvent, such as IPA. In a second step, the coating is baked for about a second amount of time, such as 15 minutes, at a second temperature of about 330° C. such that PFA particles are allowed to sufficiently melt and coalesce to form an integrated film. In other words, the first temperature is lower than the second temperature.

Fuser

Figure 8:
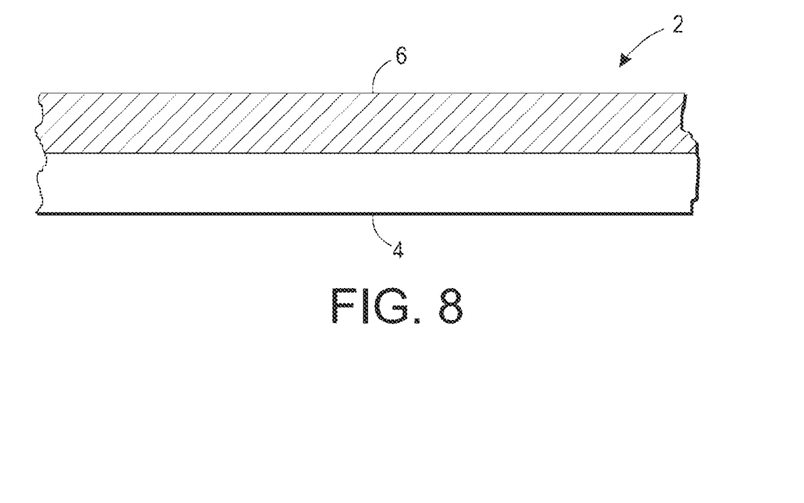
FIG. 8 illustrates an article of manufacture comprising a carbon-nanoparticle/fluoropolymer composite layer, according to an embodiment of the present disclosure.

FIG. 8 illustrates a schematic cross-sectional view of layers of article of manufacture, such as a fuser 2, comprising a substrate 4; and a composite layer 6 formed on the substrate. The composite layer 6 is formed by depositing a coating composition comprising a plurality of composite particles dispersed in a polymer binder. As discussed herein, the composite particles comprise a fluoropolymer particle and a perfluorosulfonated polymer-treated, carbon nanoparticles-comprising particle. For example, the composite particles comprise at least one of (a) a perfluorosulfonated polymer-treated, carbon nanotube-comprising particle and (b) a perfluorosulfonated polymer-treated graphene-comprising particle and a fluoropolymer particle.

The substrate 4 over which the composite layer is coated can be any suitable substrate. Suitable substrates are known in the art and examples are described in more detail below.

After depositing the coating composition on substrate 4, one or more heating steps are carried out to remove liquid continuous phase fluid and flow the fluoropolymer particles. Any of the methods discussed herein for heating and flowing the composite particles can be employed.

The resulting composite layer 6 comprises the flowed fluoropolymer and a plurality of the carbon nanoparticle-comprising particles. For example, the resulting composite layer 6 comprises the flowed fluoropolymer and a plurality of at least one of (a) carbon nanotube-comprising particles (for example, a 3-dimensional CNTs network) and (b) graphene-comprising particles (for example, a 3-dimensional CNTs and graphene network). The perfluorosulfonated polymer-treated carbon nanotubes-comprising particles and/or perfluorosulfonated polymer-treated graphene-comprising particles can be present in layer 6 in any desired amount. Example concentrations range from about 0.5 weight % to about 50 weight %, based on the total weight of the composite layer.

Layer 6 can have any suitable thickness. Examples of a suitable thickness of the composite layer include thicknesses ranging from about 5 microns to about 100 microns, such as about 10 microns to about 50 microns, or about 15 microns to about 35 microns.

Figure 9:
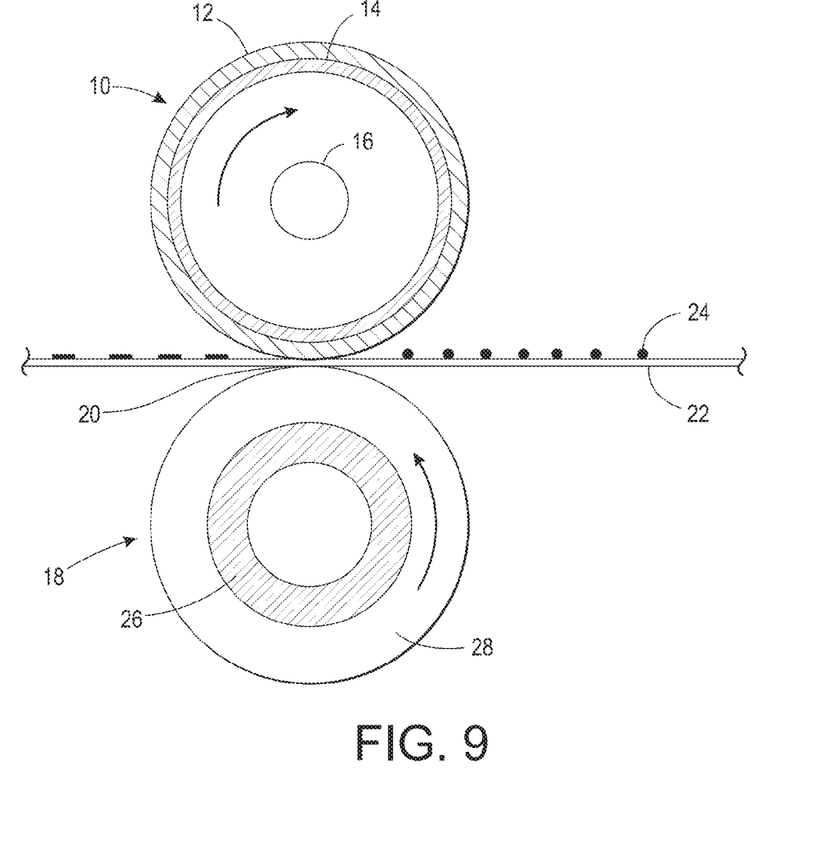
FIG. 9 illustrates a schematic view of a fuser system, according to an embodiment of the present disclosure.

An example fuser member is described in conjunction with a fuser system as shown in FIG. 9, where the numeral 10 designates a fuser roll comprising an outer layer 12 upon a suitable substrate 14. The substrate 14 can be a hollow cylinder or core fabricated from any suitable metal such as aluminum, anodized aluminum, steel, nickel, copper, and the like. Alternatively, the substrate 14 can be a hollow cylinder or core fabricated from non-metallic materials, such as polymers. Example polymeric materials include polyamide, polyimide, polyether ether ketone (PEEK), Teflon/PFA, silicone rubber and the like, and mixtures thereof, which can be optionally filled with fiber such as glass, and the like. In an embodiment, the polymeric or other core material may be formulated to include carbon nanotubes. Such core layers can further increase the overall thermal conductivity of the fuser member. In an embodiment, the substrate 14 can be an endless belt (not shown) of similar construction, as is well known in the art.

Referring again to FIG. 9, the substrate 14 can include a suitable heating element 16 disposed in the hollow portion thereof, according to an embodiment of the present disclosure. Any suitable heating element can be employed. Suitable heating elements are well known in the art.

Backup or pressure roll 18 cooperates with the fuser roll 10 to form a nip or contact arc 20 through which a copy paper or other print substrate 22 passes, such that toner images 24 on the copy paper or other print substrate 22 contact the outer layer 12 of fuser roll 10. As shown in FIG. 9, the backup roll 18 can include a rigid steel core 26 with a soft surface layer 28 thereon, although the assembly is not limited thereto.

The design illustrated in FIG. 9 is not intended to limit the present disclosure. For example, other well known and after developed electrostatographic printing apparatuses can also accommodate and use the fuser members, sometimes referred to in the art as fixer members, described herein. For example, the depicted cylindrical fuser roll can be replaced by an endless belt fuser member. In still other embodiments, the heating of the fuser member can be by methods other than a heating element disposed in the hollow portion thereof. For example, heating can be by an external heating element or an integral heating element, as desired. Other changes and modifications will be apparent to those in the art.

As used herein, the "fuser" may be in the form of a roll, belt such as an endless belt, flat surface such as a sheet or plate, or other suitable shape used in the fixing of thermoplastic toner images to a suitable substrate.

In an embodiment, the outer layer 12 comprises any of the carbon nanoparticle-comprising particle/fluoropolymer composite compositions of the present disclosure, for example, a CNT-comprising particle/fluoropolymer composite, a graphene-comprising particle/fluoropolymer composite, or composite comprising fluoropolymer and both carbon nanotube-comprising particles and graphene-comprising particles. In an embodiment, the carbon nanoparticle-comprising particle/fluoropolymer composite materials can be chosen to provide properties that are suitable for fuser applications. For example, the fluoropolymer can be a heat stable elastomer or resin material that can withstand elevated temperatures generally from about 90° C. up to about 200° C., or higher, depending upon the temperature desired for fusing the toner particles to the substrate.

In an embodiment, there may be one or more intermediate layers between the substrate 14 and the outer layer 12. Typical materials having the appropriate thermal and mechanical properties for such intermediate layers include silicone elastomers, fluoroelastomers, EPDM (ethylene propylene hexadiene), and Teflon™ (i.e., polytetrafluoroethylene) such as Teflon PFA sleeved rollers. Examples of designs for fusing members known in the art and are described in U.S. Pat. Nos. 4,373,239; 5,501,881; 5,512,409 and 5,729,813, the entire disclosures of which are incorporated herein by reference.

The present disclosure is also directed to a method of fusing toner particles. The method comprises providing a print substrate 22, as illustrated in FIG. 9, according to an embodiment of the present disclosure. A toner image 24 can be formed by positioning toner particles on the print substrate by any suitable method. Suitable imaging methods are well known in the art.

After imaging the print substrate 22, the toner particles are contacted with a fuser roll 10 to permanently affix the image to the substrate. The fuser roll can be as described herein above, including a composite layer formed on a fuser substrate, the composite layer comprising a fluoropolymer and at least one of (a) a plurality of perfluorosulfonated polymer-treated, carbon nanotubes-comprising particles, and (b) a plurality of perfluorosulfonated polymer-treated, graphene-comprising particles.

Fixing performance of a toner can be characterized as a function of temperature. The minimum fixing temperature (MFT) of the toner, which is the minimum temperature at which acceptable adhesion of the toner to the support medium occurs, that is, as determined by, for example, a crease test. The maximum temperature at which the toner does not adhere to the fuser roll is called the hot offset temperature (HOT). When the fuser temperature exceeds HOT, some of the molten toner adheres to the fuser roll during fixing and is transferred to subsequent substrates containing developed images, resulting for example in blurred images. This undesirable phenomenon is called offsetting. The difference between MFT and HOT is called the fusing latitude of the toner, i.e., the temperature difference between the fixing temperature and the temperature at which the toner offsets onto the fuser. It is desirable to have a large fusing latitude.

EXAMPLES

The following examples are directed to composites comprising PFA and at least one of a carbon nanotube-comprising particles and a graphene-comprising particles, wherein the carbon nanotubes-comprising particles are perfluorosulfonated polymer-treated, multi-walled carbon nanotubes (MWCNT), and the graphene-comprising particles are perfluorosulfonated polymer-treated graphene platelets. More specifically, the composite materials are made from a solution-based formulation containing PFA particles and at least one of (a) MWCNTs which are perfluorosulfonated polymer-treated and have affinity with PFA particles and (b) graphene platelets which are perfluorosulfonated polymer-treated and have affinity with PFA particles. As discussed in more detail below, each of the MWCNTs and the the graphene platelets are first exfoliated by sonication of a carbon nanotubes-liquid continuous phase (e.g, IPA) dispersion containing perfluorosulfonated polymer (Nafion), and a graphene-liquid continuous phase (e.g., IPA) dispersion containing Nafion, respectively. In one example, the uniform dispersion comprising carbon nanotubes is then mixed with a PFA-liquid continuous phase (e.g., IPA) dispersion and a coalescent (TEXANOL) is added to form a flow-coatable PFA formulation. In another embodiment, the uniform dispersion comprising carbon nanotubes and the uniform dispersion comprising graphene are mixed together with the PFA-liquid continuous phase dispersion, and the coalescent is added to form an alternate flow-coatable PFA formulation. Either of the While mixing, the exfoliated graphene platelets and/or the exfoliated MWCNTs adhere to the PFA particle surface.

All percentages in the examples below are percent by weight, unless otherwise specified.

Example 1A and 1B

Composite Dispersion Overview

Example 1A

Preparation of a 2% CNT/Nafion/PFA/IPA Dispersion

Figure 10:
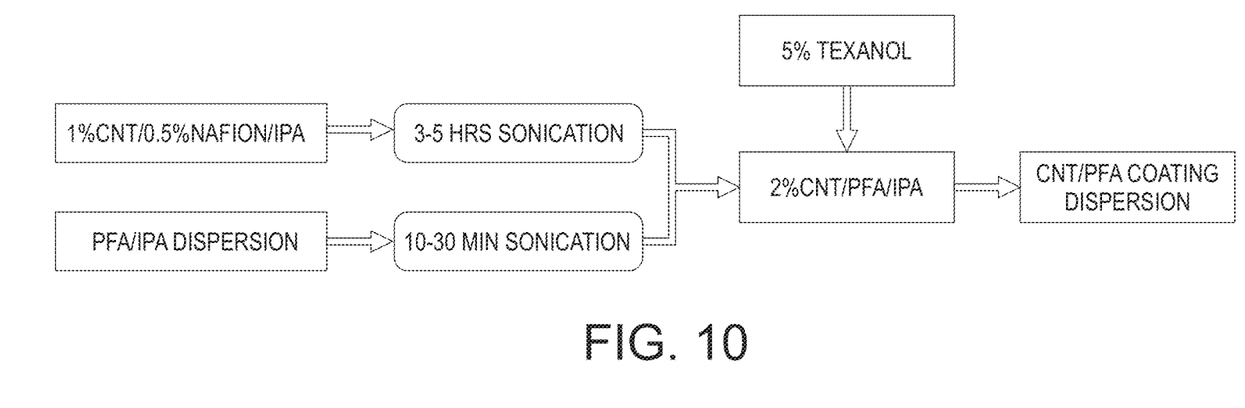
FIG. 10 is a flow chart showing steps in a method of forming a CNT/PFA coating dispersion according to an embodiment of the present disclosure.

Carbon nanotube surface treatment with perfluorosulfonated polymer was carried out to develop a composition of the carbon nanotube/PFA composite with improved uniformity according to a dispersion process shown in FIG. 10.

Example 1A-1

1% CNT/0.5% Nafion/IPA Dispersion

A CNT/Nafion/IPA dispersion was prepared by adding 0.4 g of Multi-Walled CNT powder (available from Cheap Tubes, Inc.; Brattleboro, Vt.) into an 40 g isopropanol (IPA) solution containing 3.2 g of Nafion 117 solution (5 wt % mixed H2O/IPA available from Sigma-Aldrich) as in step 1001, followed by exfoliating by ultrasonication for about 3 to about 5 hrs as in 1005, for example, about 3 hours with 60% output.

Example 1A-2

PFA Dispersion 3 g of PFA powder (PFA320, available from DuPont) was dispersed into 1-2 g of IPA as in step 1003, with sonication for about 10-30 minutes as in step 1007, for example about 30 minutes with 60% output.

Example 1A-3

CNT/Nafion/IPA/PFA Coating Dispersion

The CNT/Nafion/IPA dispersion of 1001/1005 (6 g) was then mixed with the PFA/IPA dispersion of 1003/1007 by further sonication to form a 2% CNT/PFA/IPA dispersion in step 1009. About 0.15 g of Texanol (Item 538221 available from Sigma-Aldrich) was added in step 1011 to the dispersion of 1009, with rolling, to form homogeneous composite coating dispersion 1013.

Figure 4A:
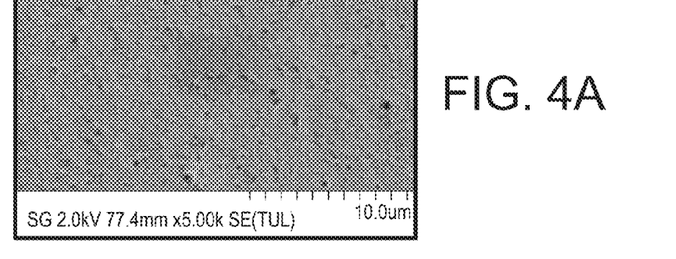
FIGS. 4A-4C are SEM images of CNT/PFA dispersions in which the CNTs are treated with perfluorosulfonated polymer according to an embodiment of the presented disclosure.
Figure 4B:
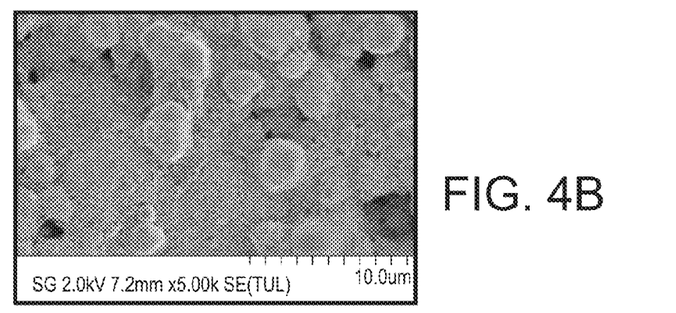
Figure 4C:
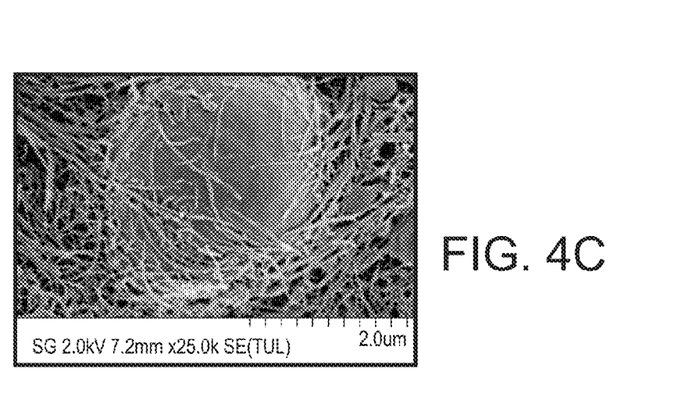

Good dispersion quality of CNTs with Nafion in IPA is confirmed by SEM image as shown in the 1% CNT/0.5% Nafion/IPA dispersion of FIG. 4A. A 2% CNT/Nafion/PFA dispersion is shown in the SEM image of FIG. 4B, with a close up in FIG. 4C showing that Nafion also helps in providing excellent association of CNT with PFA particles, for example, as compared to the dispersions in FIGS. 2A and 3A which comprise carbon nanotubes not treated with perfluorosulfonated polymer such as Nafion.

Example 1B

Preparation of a 1% CNT/1% Graphene/Nafion/PFA/IPA Composite Dispersion

Figure 11:
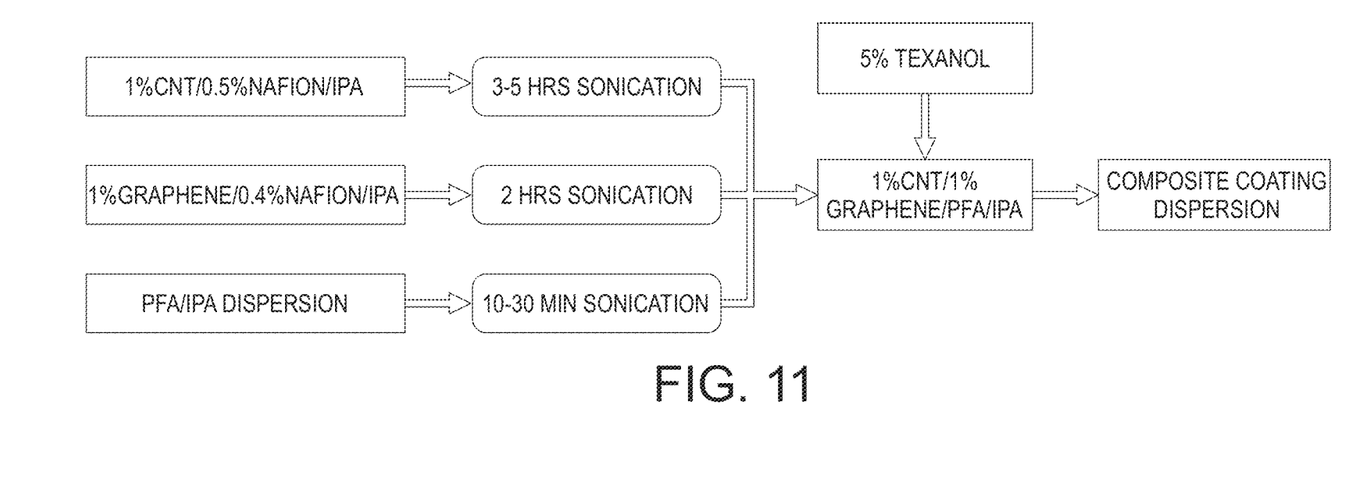
FIG. 11 is a flow-chart chosing steps in a method of forming a CNT/Graphene/PFA coating dispersion according to an embodiment of the present disclosure.

Carbon nanotube surface treatment with perfluorosulfonated polymer and graphene surface treatment with perfluorosulfonated polymer was carried out to develop a composition of the carbon nanotube/graphene/PFA composite with improved uniformity according to a dispersion process shown in FIG. 11.

Example 1B-1

1% CNT/0.4% Nafion/IPA Dispersion

A CNT/Nafion/IPA dispersion was prepared by adding 0.4 g of Multi-Walled CNT powder (available from Cheap Tubes, Inc.; Brattleboro, Vt.) into an 40 g isopropanol (IPA) solution containing 3.2 g of Nafion 117 solution (5 wt % mixed H2O/IPA available from Sigma-Aldrich) as in step 1101, followed by exfoliating by ultrasonication for about 3 to about 5 hrs as in 1105, for example, about 3 hours with 60% output.

Example 1B-2

1% Graphene/0.4% Nafion/IPA Dispersion

A graphene/Nafion/IPA dispersion was prepared by adding 0.4 g of graphene powder (item 06-0210 available from Strem Chemicals, Inc.; Newburyport, Mass.) into an 40 g isopropanol (IPA) solution containing 3.2 g of Nafion 117 solution (5 wt % mixed H2O/IPA available from Sigma-Aldrich) as in step 1102, followed by exfoliating by ultrasonication for about 3 to about 5 hrs as in 1106, for example, about 3 hours with 60% output.

Example 1B-3

PFA Dispersion 10 g of PFA powder (PFA320, available from DuPont) was mixed with 4 g of IPA as in step 1103, with sonication for about 10-30 minutes as in step 1007, for example about 30 minutes with 60% output.

Example 1B-4

PFA Composite Coating Dispersion

The CNT/Nafion/IPA Dispersion of 1101/1105 (10 g) and the Graphene/Nafion/IPA dispersion of 1102/1106 (10 g) were then mixed with the PFA/IPA dispersion of 1103/1107 by further sonication for 30 minutes with 60% output in step 1109. Texanol was added in step 1111 to the 1% CNT/1% graphene/Nafion/PFA/IPA dispersion of 1109, with rolling, to form uniform coating dispersion 1113.

Figure 5A:
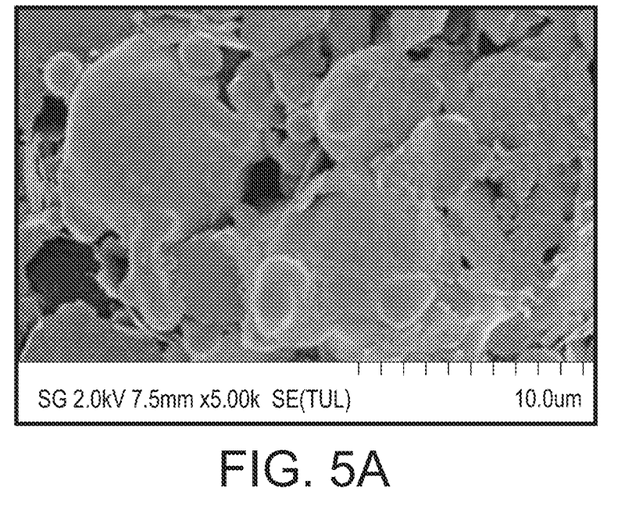
FIG. 5A-5B are SEM images of graphene/PFA dispersions in which the graphene particles are treated with perfluorosulfonated polymer according to an embodiment of the presented disclosure.
Figure 5B:
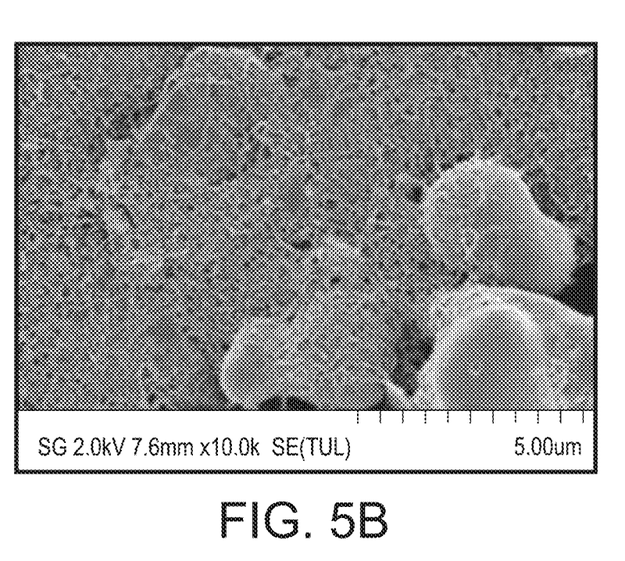

Compared to FIG. 1A, for example, perfluorosulfonated polymer-treated, graphene-comprising particles show more exfoliation and attachment with PFA particles as shown in the SEM image of a 2% graphene/PFA/IPA dispersion in FIG. 5A. Accordingly, both CNTs and graphene nanplatelets associate together with PFA particles and form good dispersion as shown in the SEM image of a 1% CNT/1% graphene/PFA/IPA dispersion in FIG. 5B.

Example 2A-2B

Composite Coating Preparation

Example 2A

Figure 6A:
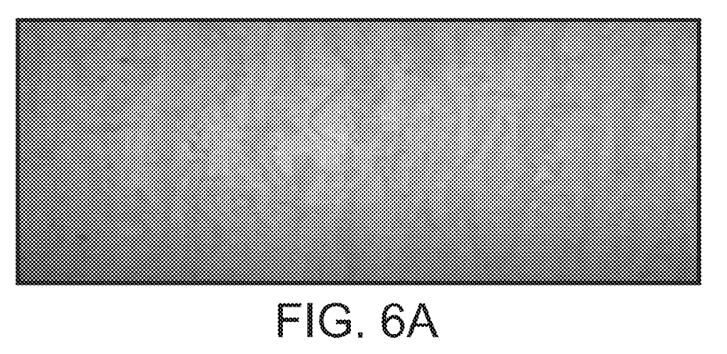
FIG. 6A is a photograph of a coating formed of CNT/PFA particles in which the CNTs are treated with perfluorosulfonated polymer according to an embodiment of the present disclosure.
Figure 6B:
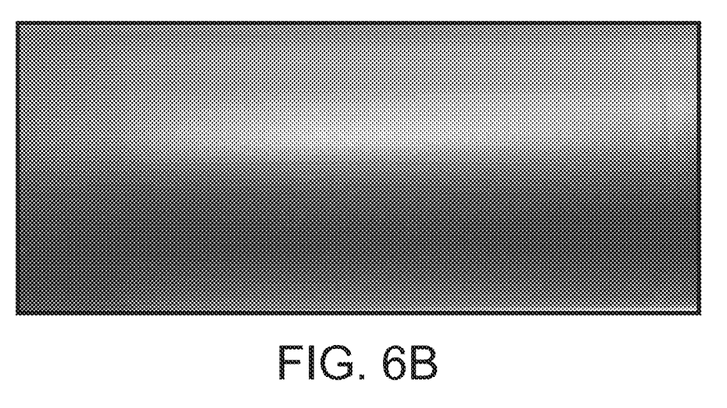
FIG. 6B is a photograph of a CNT/PFA dispersion including a leveling agent, in which the CNTs are treated with perfluorosulfonated polymer according to an embodiment of the present disclosure.
Figure 6C:
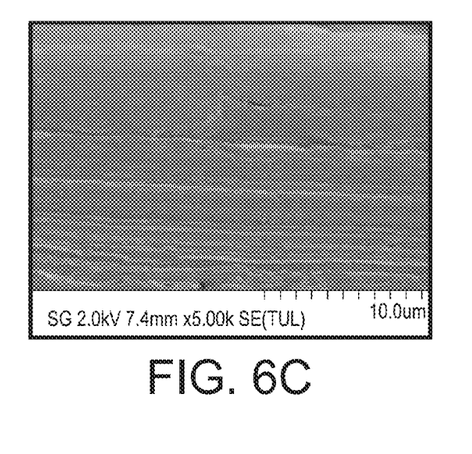
FIG. 6C is an SEM image showing a close-up of a defect-free dense film obtained from a CNT/PFA dispersion formulation of FIG. 6B, according to an embodiment of the present disclosure.

A composite coating was produced by application of the 2% CNT/Nafion/PFA/IPA dispersion composite dispersion of Example 1A onto a silicone rubber substrate by flow coating and followed by baking in an oven for 15 minutes at 340° C. SEM image in FIG. 6A shows that the application of CNT/Nafion/PFA coating dispersion on silicone substrate by flow coating technique shows unevenness and cracks. As described above, Texanol ester alcohol is added as a leveling agent and coalescent to help with the flow coating reheology and final coating uniformity without negative impact after baking as shown in FIG. 6B. The SEM image of FIG. 6C confirms a 3-dimensional CNTs network and defect free composite coating from the coating dispersions described above with as low as 5% of Texanol.

The above CNT/PFA composite composition contained per-fluorosulfonated polymer-treated multiwalled carbon nanotubes. The perfluorosulfonated polymer-treated multiwalled carbon nanotubes adhered to the PFA particles.

Example 2B

Figure 7A:
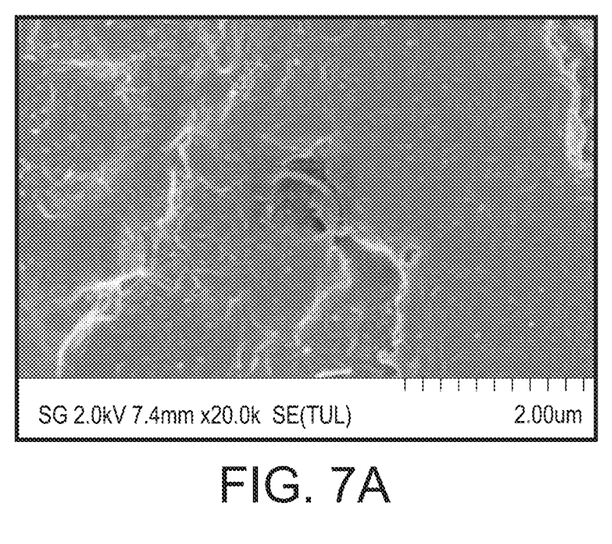
FIGS. 7A-7B are EM images showing a surface and cross-section, respectively, of a CNT/graphene/PFA coating in which the carbon nanotubes and graphene platelets are treated with perfluorosulfonated polymer according to an embodiment of the present disclosure.
Figure 7B:
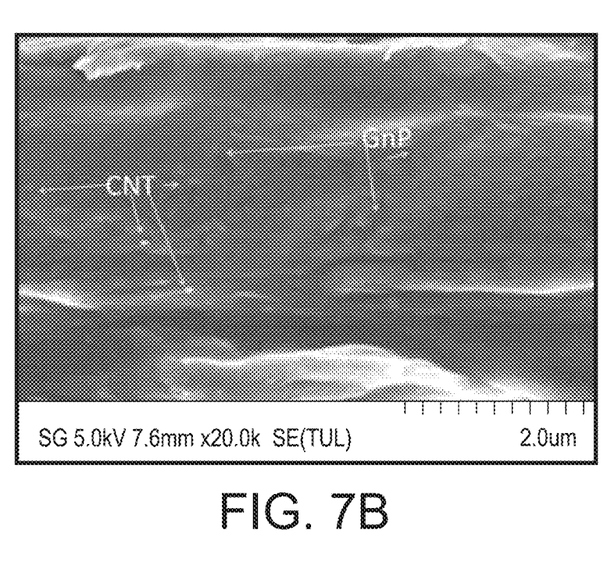

A composite coating was produced by application of the 1% CNT/1% graphene/PFA/IPA composite dispersion of Example 1B onto a silicone rubber substrate by flow coating and followed by baking in an oven for 15-20 minutes at 340° C. SEM images in FIGS. 7A-7B confirm a 3-dimensional CNTs and graphene network and defect free composite coating without voids or agglomeration of the carbon nanotubes and graphene.

The above CNT/Graphene/PFA composite composition contained perfluorosulfonated polymer-treated multiwalled carbon nanotubes and perfluorosulfonated polymer-treated graphene platelets. The perfluorosulfonated polymer-treated multiwalled carbon nanotubes and the perfluorosulfonated polymer-treated graphene platelets adhered to the PFA particles.

Example 4A-4B

Fuser Topcoat Preparation

Example 4A

Figure 12:
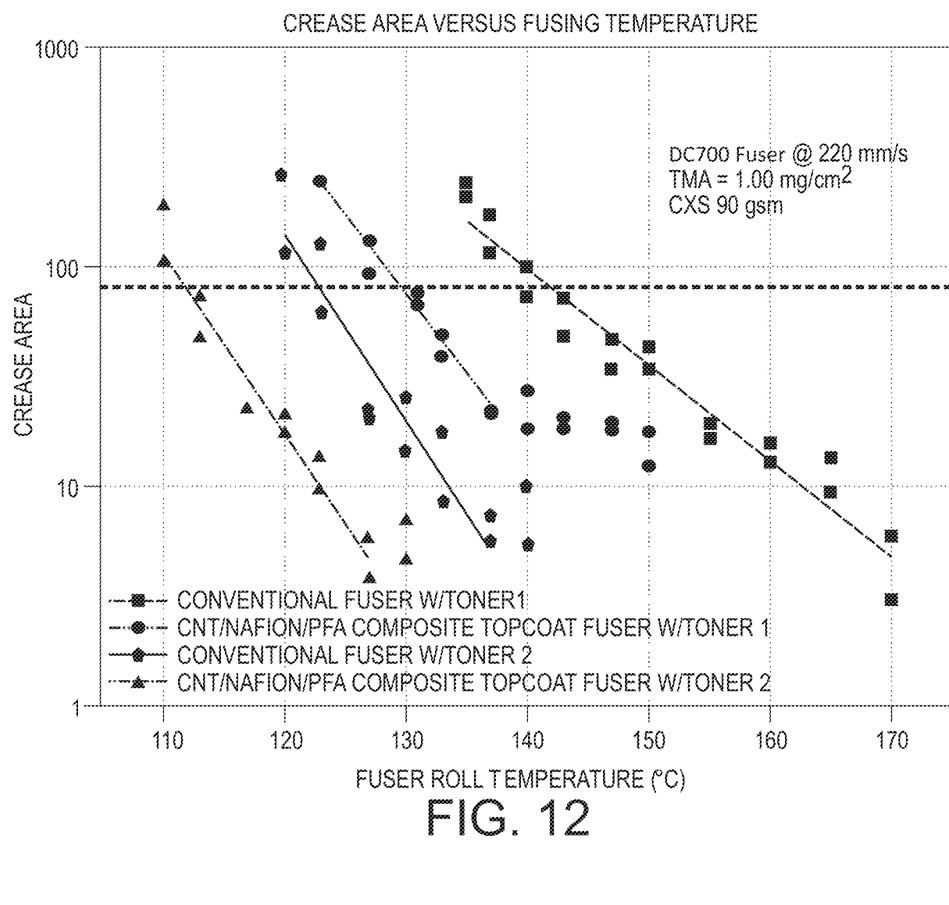
FIG. 12 is a graph showing crease area versus fusing temperature data according to examples described herein below.

A fuser topcoat made from the CNT/Nafion/PFA composite formulation of Example 1A can be prepared by flow coating the coating dispersion onto a primed silicone substrate fuser roll, followed by baking above the melting temperature of PFA (e.g. 340° C.) for 15 minutes. The resulting uniform and homogeneous CNT/PFA composite fuser topcoat produced from the disclosed coating formulation exhibits improved thermal conductivity by reducing the fusing crease MFT. The resulted coating showed lower crease fix MFT for EAHG and Pinot toner relative to the production DC700 fuser roll as shown in the graph in FIG. 12. The mechanical robustness and electrical conductivity are also improved.

Example 4B

A fuser topcoat made from the CNT/Graphene/Nafion/PFA composite formulation of Example 1B can be prepared by flow coating the coating dispersion onto a prime silicone substrate fuser roll at 123 RPM, coating speed of 2 mm/s, flow rate of ⅜ ml/min and the blade y-position of 56.5 cm, which enables a good contact of the blade to the roll without too much pressure. After air-drying, the roll with composite coating can be baked for 1 hour at 100° C. to remove any residual solvent, and baked above the melting temperature of PFA (e.g., 340° C.) for 15 minutes to cure.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A fuser comprising:
   a substrate; and
   a composite layer formed on the substrate, the composite layer comprising:
   a fluoropolymer;
   a first particle comprising a first perfluorosulfonated polymer and carbon nanotubes; and
   a second particle comprising a second perfluorosulfonated polymer and graphene.

2. The fuser of claim 1, wherein the substrate is a silicone fuser roll.

3. The fuser of claim 1, wherein the first perfluorosulfonated polymer is represented by formula (I):

where m is an integer greater than or equal to 1, n is an integer greater than or equal to 1, p is an integer greater than or equal to 1, X is a sulfonic functional group, and M a functional group selected from —OH and —OSi(CH3)$_3$.

4. The fuser of claim 3, wherein the carbon nanotubes are multiwall carbon nanotubes, and
   the graphene comprises graphene platelets.

5. The fuser of claim 1, wherein the composite layer comprises a plurality of the first particles and a plurality of the second particles, each present in an amount of about 0.5 to 50 weight percent based on the total weight of the composite layer.

6. The fuser of claim 1, wherein the fluoropolymer is a fluoroplastic resin.

7. The fuser of claim 6, wherein the fluoroplastic resin is selected from the group consisting of polytetrafluoroethylene (PTFE), perfluoroalkoxy polymer resin (PFA), poly(tetrafluoroethylene-co-perfluoropropyl vinyl ether), fluorinated ethylenepropylene copolymer (FEP), and a combination thereof.

8. The fuser of claim 1, wherein the thickness of the composite layer ranges from about 5 microns to about 100 microns.

9. The fuser of claim 1, further comprising a release layer formed over the composite layer.

10. The fuser of claim 1, wherein the first and second particles each further comprise isopropanol and an ester-alcohol coalescent, and wherein the ester-alcohol coalescent comprises 2,2,4-trimethyl-1,3-pentanediol monoisobutyrate.

* * * * *